United States Patent
Lee et al.

(10) Patent No.: US 7,616,136 B2
(45) Date of Patent: Nov. 10, 2009

(54) MESSAGE COMPRESSION METHODS AND SYSTEMS

(75) Inventors: Chang-Hung Lee, Yunlin (TW); Hsin-Che Hsieh, Taoyuan (TW)

(73) Assignee: Qisda Corporation, Taoyuan County (TW)

( * ) Notice: Subject to any disclaimer, the term of this patent is extended or adjusted under 35 U.S.C. 154(b) by 719 days.

(21) Appl. No.: 11/338,982

(22) Filed: Jan. 24, 2006

(65) Prior Publication Data

US 2006/0181443 A1    Aug. 17, 2006

(30) Foreign Application Priority Data

Jan. 26, 2005    (TW) ............................... 94102294 A (51) Int. Cl.
*H03M 7/40* (2006.01)
(52) U.S. Cl. ............................... 341/67; 341/51; 341/65
(58) Field of Classification Search ................... 341/65, 341/67
See application file for complete search history.

(56) References Cited

U.S. PATENT DOCUMENTS

| | | | | |
|---|---|---|---|---|
| 4,168,513 A | * | 9/1979 | Hains et al. ................. | 382/244 |
| 5,548,338 A | * | 8/1996 | Ellis et al. ..................... | 725/54 |
| 6,140,945 A | * | 10/2000 | Yokose ......................... | 341/65 |
| 6,411,227 B1 | * | 6/2002 | Fish ............................. | 341/65 |
| 6,563,438 B2 | * | 5/2003 | Satoh .......................... | 341/51 |
| 7,126,500 B2 | * | 10/2006 | Adams et al. ................. | 341/50 |

FOREIGN PATENT DOCUMENTS

CN    1193428    9/1998

* cited by examiner

*Primary Examiner*—Khai M Nguyen (57) ABSTRACT

A method for message compression comprises receiving a first text message, acquiring at least one frequent character combination in the first text message, calculating frequencies for the frequent character combination and characters occurring in the first text message, generating multiple representative codes respectively for the frequent character combination and characters, and encoding the first text message to a second text message.

18 Claims, 9 Drawing Sheets

MESSAGE COMPRESSION METHODS AND SYSTEMS

BACKGROUND

The present invention relates to message compression, and more particularly, to message compression methods and systems.

Message compression is utilized to represent an original message in fewer bits or bytes. The amount of space required to transmit a message via a network can be reduced significantly using compression. Compression methods create a reduced representation by identifying and using structures that exist in the message. From the compressed version, the original message can be exactly reconstructed. Message compression becomes an increasingly important in a message transmission environment, as it reduces costs associated with bandwidth requirements, input/output (I/O) overhead, and communication delays. The gain obtained from compressing messages is that transmission over a communication link takes less time.

SUMMARY

Message compression methods are provided. An embodiment of a message compression comprises receiving a first text message, acquiring at least one frequent character combination in the first text message, calculating frequencies for the frequent character combination and the characters occurring in the first text message, generating multiple representative codes respectively for the frequent character combination and the characters contingent upon frequencies for the frequent character combination and the characters, and encoding the first text message to a second text message contingent upon the representative codes. Wherein, the frequent character combination comprises at least two characters among multiple characters in the first text message, and the frequent character combination or one of the characters with higher frequencies is represented by one of the representative codes with fewer or equal digits.

The frequent character combination in the first text message may be acquired by an association mining method. The association mining method may acquire at least one of the potential character combinations whose frequency occurring in the first text message exceeding a threshold. The representative codes may be generated by Huffman coding method. The method may further comprise transmitting the second text message with the representative codes to a receiver, enabling the receiver to acquire the first text message from the second text message according to the representative codes.

A machine-readable storage medium storing a computer program which, when executed by an electronic apparatus, performs the method of message compression is also disclosed.

Systems for message compression are provided. An embodiment of a message compression system comprises an electronic apparatus. The electronic apparatus receives a first text message, acquires at least one frequent character combination in the first text message, calculates frequencies for the frequent character combination and multiple characters occurring in the first text message, generates multiple representative codes respectively for the frequent character combination and the characters contingent upon frequencies for the frequent character combination and the characters, and encodes the first text message to a second text message contingent upon the representative codes. Wherein the frequent character combination comprises at least two of the characters in the first text message, and the frequent character combination or one of the characters with higher frequencies is represented by one of the representative codes with fewer or equal digits. The electronic apparatus may acquire frequent character combinations using an association mining method. The association mining method may acquire at least one of the potential character combinations whose frequency occurring in the first text message exceeding a threshold. The electronic apparatus may further generate the representative codes using Huffman coding method. The electronic apparatus may further transmit the second text message with the representative codes to a receiver, enabling the receiver to acquire the first text message from the second text message according to the representative codes.

The electronic apparatus may be a computer, a PDA (personal digital assistant), a MS (mobile station), a MSC (message switching center) or a SMSC (short message switching center). Any one of the characters may be Chinese character, alphanumeric character, punctuation mark or icon. The frequencies of the frequent character combinations may be length of the frequent character combination multiplied by occurrence of the frequent character combination occurring in the first text message.

DESCRIPTION OF THE DRAWINGS

The invention will become more fully understood by referring to the following detailed description of embodiments with reference to the accompanying drawings, wherein.

DETAILED DESCRIPTION

Figure 1:
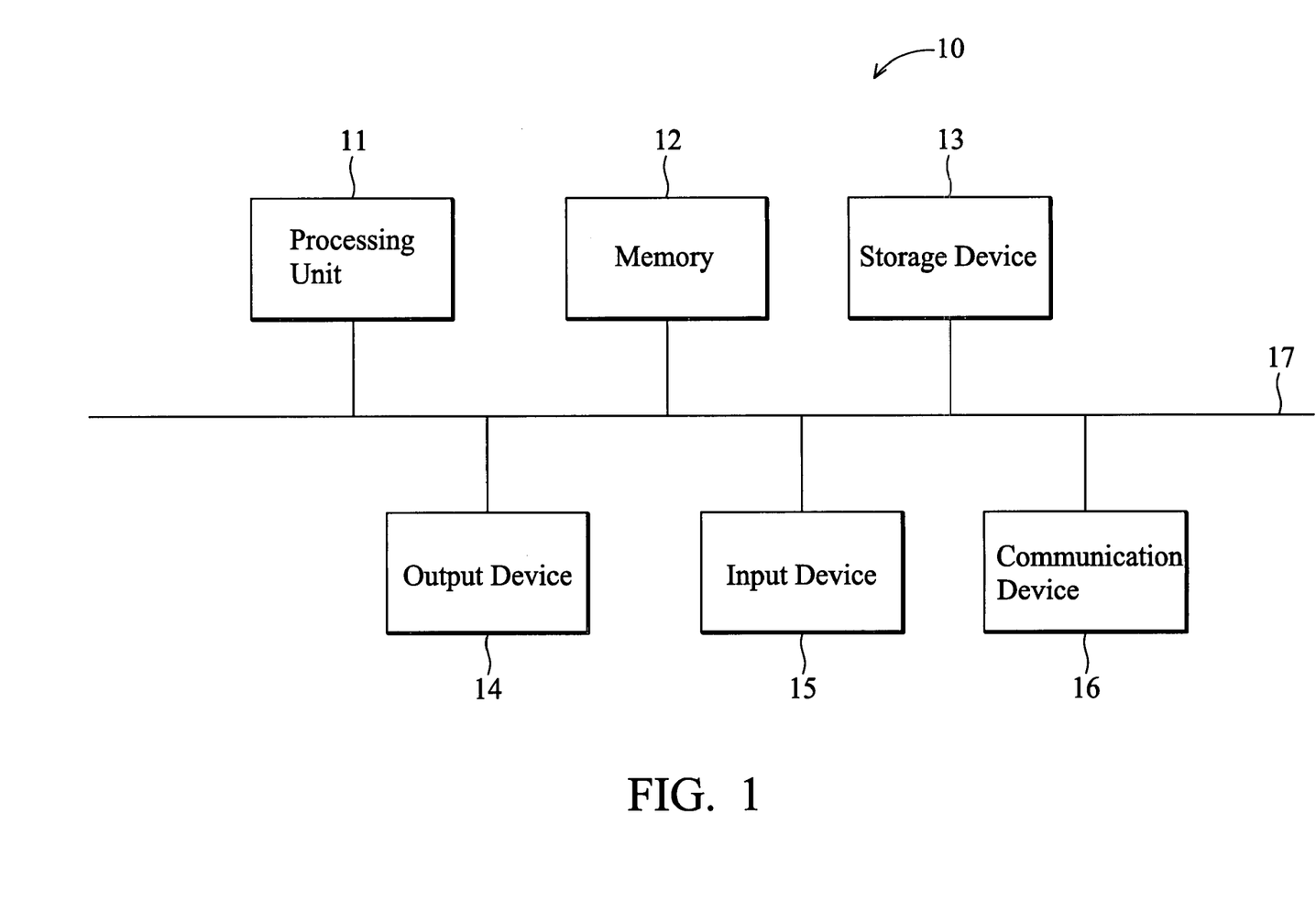
FIG. 1 is a diagram of a hardware environment applicable to an embodiment of a computer.

FIG. 1 is a diagram of a hardware environment applicable to an embodiment of a computer 10, comprising a processing unit 11, a memory 12, a storage device 13, an output device 14, an input device 15 and a communication device 16. The processing unit 11 is connected by buses 17 to the memory 12, storage device 13, output device 14, input device 15 and communication device 16 based on Von Neumann architecture. There may be one or more processing units 11, such that the processor of the computer comprises a single central processing unit (CPU), a microprocessing unit (MPU) or multiple processing units, commonly referred to as a parallel processing environment. The memory 12 is preferably a random access memory (RAM), but may also include read-only memory (ROM) or flash ROM. The memory 12 preferably stores program modules executed by the processing unit 11 to perform message compression functions. Generally, program modules include routines, programs, objects, components, scripts, Web pages, or others, that perform particular tasks or implement particular abstract data types. Moreover, those skilled in the art will understand that some embodiments may be practiced with other computer system configurations, including handheld devices, multiprocessor-based, microprocessor-based or programmable consumer electronics, network PCs, minicomputers, mainframe computers, and the like. Some embodiments may also be practiced in distributed computing environments where tasks are performed by remote processing devices linked through a communication network. In a distributed computing environment, program modules may be located in both local and remote memory storage devices based on various remote access architecture such as DCOM, CORBA, Web objects, Web Services or other similar architectures. The storage device 13 may be a hard drive, magnetic drive, optical drive, portable drive, or nonvolatile memory drive. The drives and associated computer-readable media thereof (if required) provide nonvolatile storage of computer-readable instructions, data structures and program modules.

Figure 2:
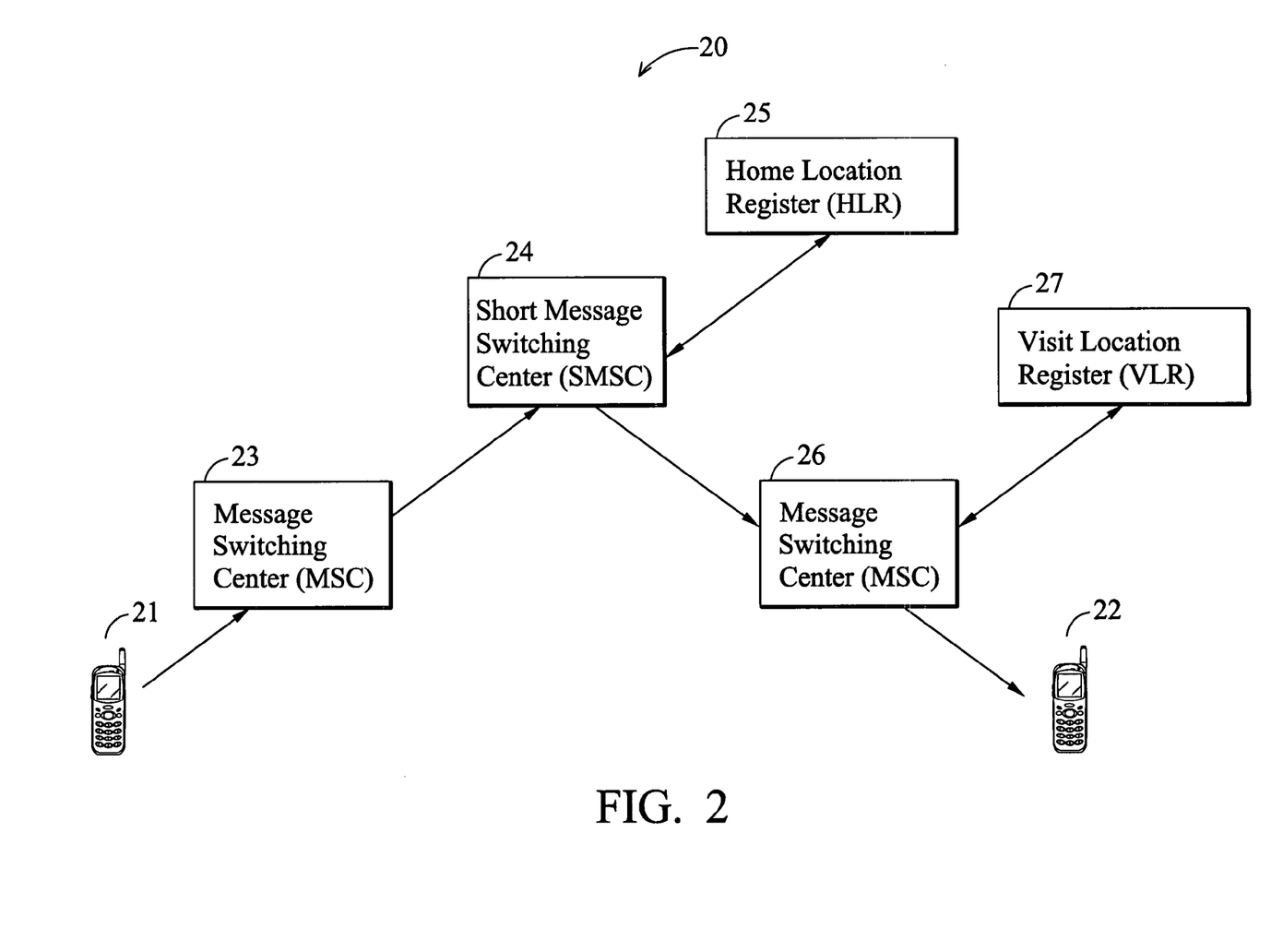
FIG. 2 is a schematic diagram of an embodiment of a GSM network for SMS (short message service)

FIG. 2 is a schematic diagram of an embodiment of a GSM network for SMS (short message service). The architecture includes MSs (mobile stations) 21, 22, MSCs (message switching centers) 23, 26, a SMSC (short message switching center) 24, a HLR (home location register) 25, and a VLR (visit location register) 27. The MSC 23 connects multiple base stations (not shown) to receive the MS from the MS 21. When the MS 21 sends a SM (short message) to the MS 22, the SM is first transmitted to the SMSC 24 via the MSC 23. The HLR provides a database storing all MS (i.e., subscriber) profile information and service configuration information for each MS in GSM network for SMS authentication. The SMSC 24, the kernel device for SMS, stores the SM temporarily, authenticates the MS 22 by interrogating the HLR 25, and transmits the SM to the MSC 26 until the MS 22 is active within a time period; otherwise, time-out control is executed. The VLR 27 provides a database storing base station information in which the MS 22 is registered, thus enabling the MSC 26 to transmit SM to the MS 22 via the relevant base station (not shown).

Figure 3:
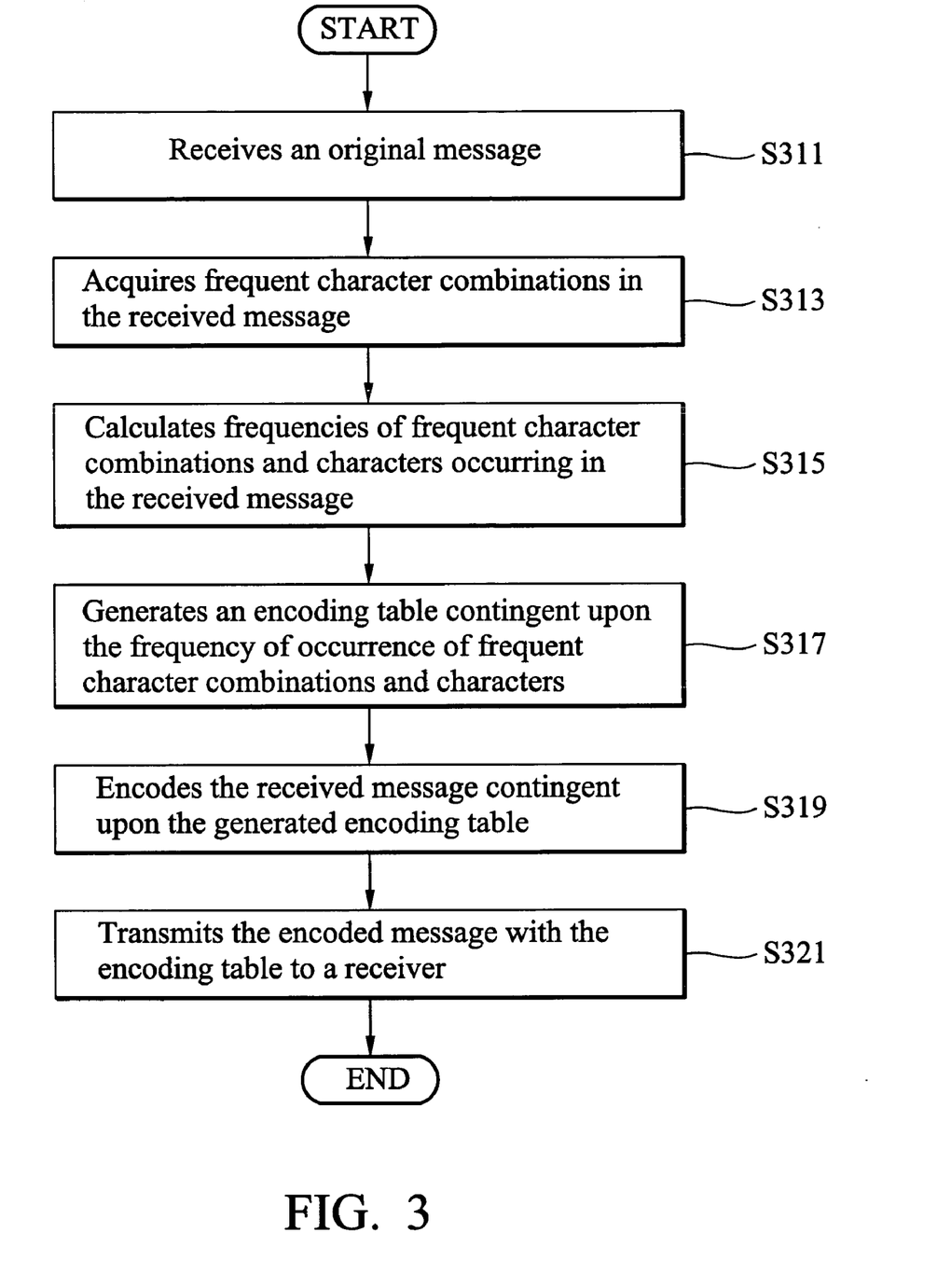
FIG. 3 is a flowchart of an embodiment of a message compression method.

FIG. 3 is a flowchart of an embodiment of a message compression method employed in message transmissions between a transmitter and a receiver, in which the transmitter or receiver may be a computer system, a MS, a personal digital assistant (PDA), a MSC or a SMSC.

In step S311, an original message is received. The original message may comprise Chinese characters, alphanumeric characters, punctuation marks or icons. In step S313, frequent character combinations in the received message are acquired. The lengths of SMs or messages transmitted between instant messaging systems are typically short, thus, in the beginning, frequent character combinations instead of frequent words are identified by various association mining methods. Mined frequent character combinations are those character combinations exceeding a predetermined minimum support. An exemplary association mining method with efficient computation capability is further described in the following, or otherwise, various well-known association mining methods can be employed. Note that, in this step, languages such as English, Chinese and the like may be considered for employing relevant association mining methods. In step S315, frequencies of frequent character combinations and characters occurring in the received message are calculated.

In step S317, an encoding table contingent upon the frequency of occurrences of frequent character combinations and characters is generated. In the encoding table, frequent character combinations or characters with a higher frequency of occurrence in the received message are encoded in fewer or equal digits than those with a lower frequency of occurrence. The well-known Huffman encoding method is preferably employed for message compression. In step S319, the received message is encoded contingent upon the generated encoding table. In steps S321, the encoded message with the encoding table is transmitted to a receiver, thereby enabling the receiver to decode the encoded message contingent upon the received encoding table.

Figure 4:
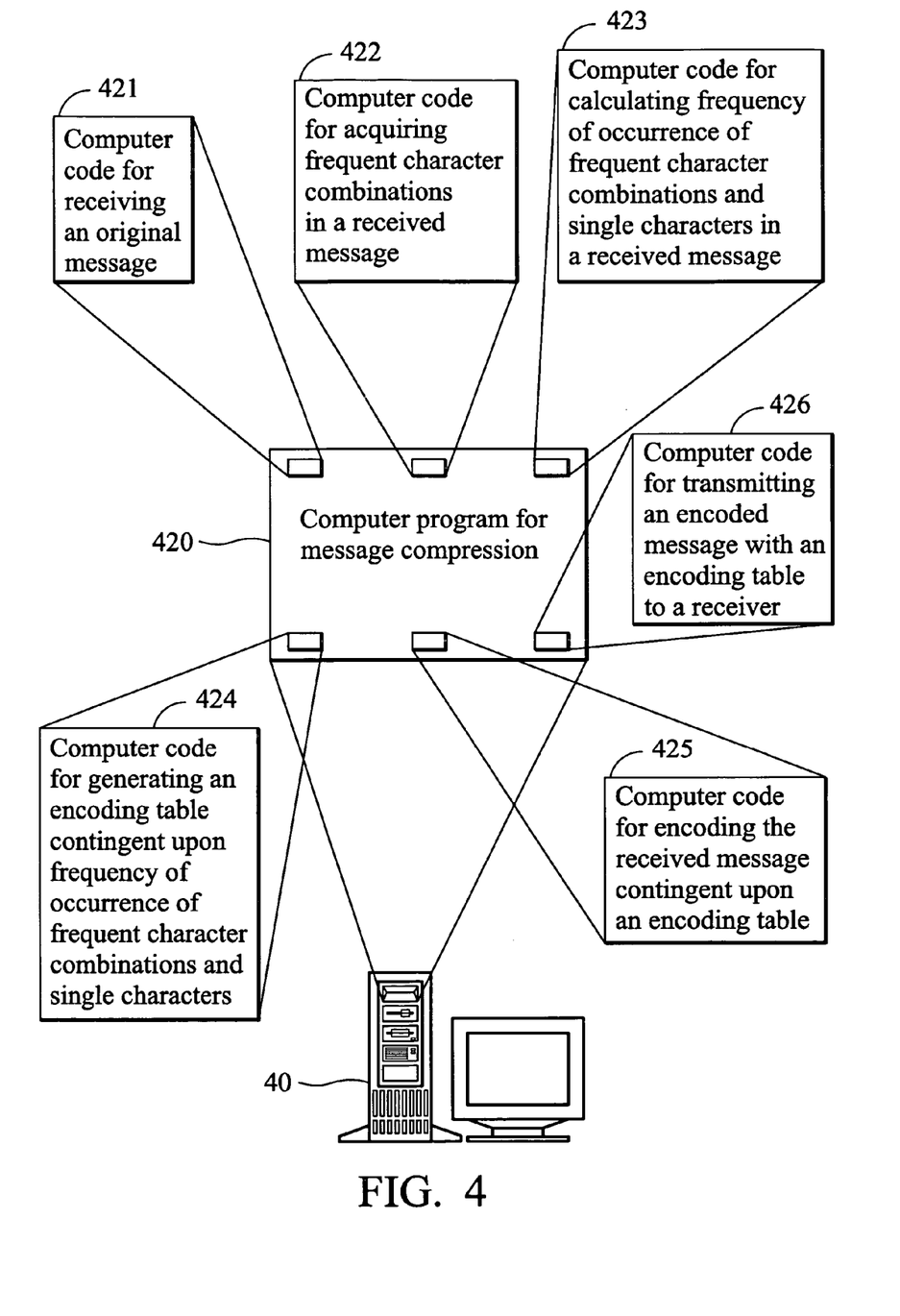
FIG. 4 is a diagram of a storage medium storing a computer program providing an embodiment of a method of message compression.

Also disclosed is a storage medium as shown in FIG. 4 storing a computer program 420 providing the disclosed methods of message compression. The computer program includes a storage medium 40 having computer readable program code therein for use in a computer system. The computer readable program code comprises at least computer readable program code 421 receiving an original message, computer readable program code 422 acquiring frequent character combinations in a received message, computer readable program code 423 calculating frequency of occurrence of frequent character combinations and single characters in a received message, computer readable program code 424 generating an encoding table contingent upon frequency of occurrence of frequent character combinations and single characters, computer readable program code 425 encoding the received message contingent upon encoding table, and computer readable program code 426 transmitting an encoded message with an encoding table to a receiver.

Computer systems, MSs, PDAs, MSCs, SMSCs and message compression methods, or certain aspects or portions thereof, may take the form of program code (i.e., instructions) embodied in tangible media, such as floppy diskettes, CD-ROMS, hard drives, or any other machine-readable storage medium, wherein, when the program code is loaded into and executed by a machine, such as a computer system, MS, PDA, MSC, SMSC and the like, the machine becomes an apparatus for practicing the invention. The disclosed methods and apparatuses may also be embodied in the form of program code transmitted over some transmission medium, such as electrical wiring or cabling, through fiber optics, or via any other form of transmission, wherein, when the program code is received and loaded into and executed by a machine, such as a computer or an optical storage device, the machine becomes an apparatus for practicing the invention. When implemented on a general-purpose processor, the program code combines with the processor to provide a unique apparatus that operates analogously to specific logic circuits.

Details of a method for Chinese message compression are illustrated in the following example. In step S311, an original Chinese message containing a series of Chinese characters, "我叫李阿三，你也可以叫我阿三", is received. In step S313, a frequent Chinese character combination, such as "阿三", in the received message are acquired. In step S315, frequencies of the frequent Chinese character combination and characters occurring in the received message are calculated, the result is shown in Table 1.

TABLE 1

| Chinese Character/Character combination | Occurrence Frequency |
|---|---|
| 我 | 2 |
| 叫 | 2 |
| 李 | 1 |
| 阿三 | 4 |
| ， | 1 |
| 你 | 1 |
| 也 | 1 |
| 可 | 1 |
| 以 | 1 |

Figure 5:
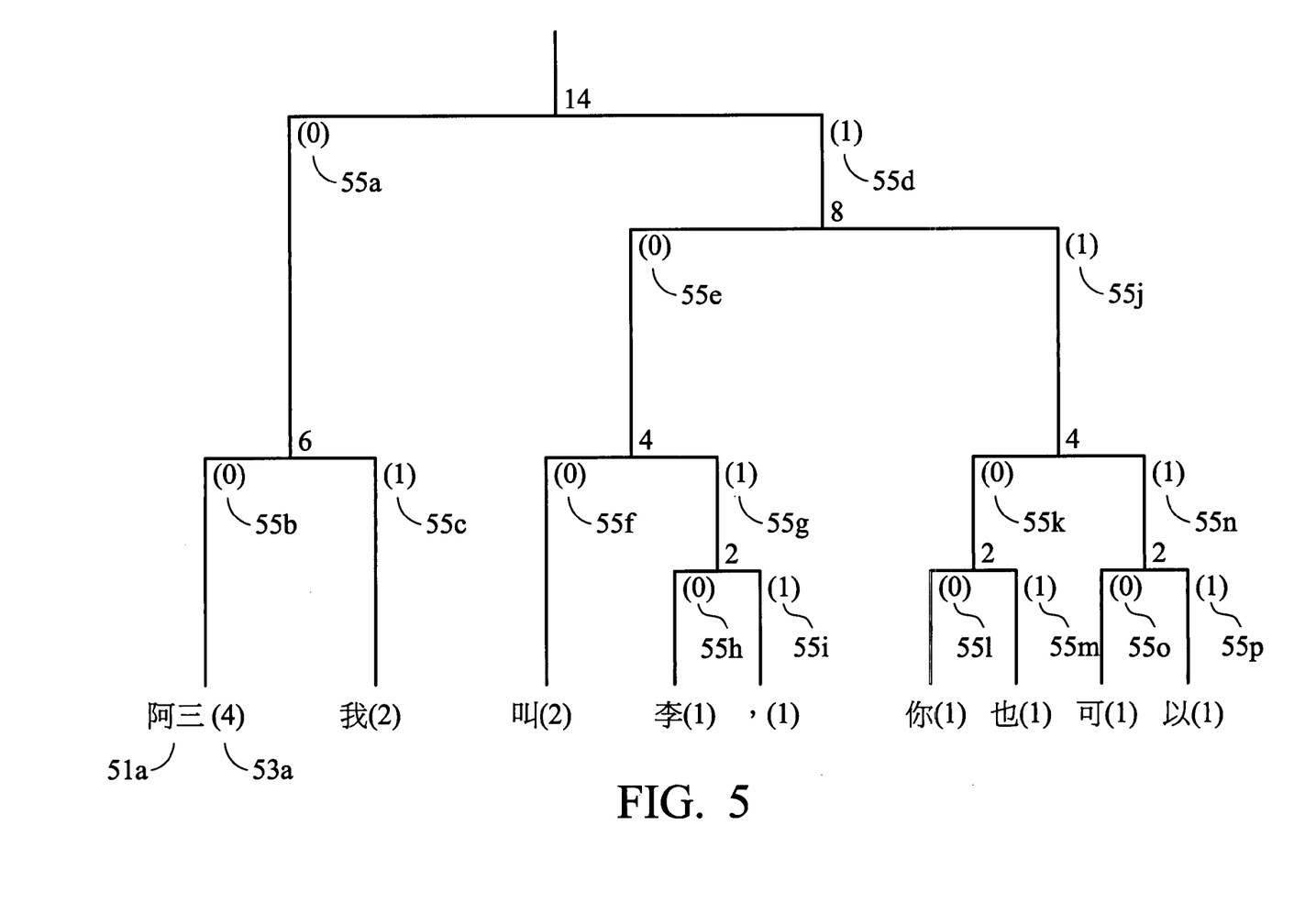
FIGS. 5 and 6 are diagrams illustrating exemplary Huffman trees.

In order to precisely predict potential reduction lengths, note that the occurrence frequencies of frequent Chinese character combinations have to be adjusted by multiplying the length of frequent Chinese character combinations. For example, the frequent Chinese character combination, "阿三", is composed of two Chinese characters, thus, the occurrence frequency thereof is 4(=2×2). In step S317, an encoding table contingent upon occurrence frequencies of frequent Chinese character combinations and single characters is generated using the Huffman encoding method. A Huffman tree as shown in FIG. 5, is first generated contingent upon occurrence frequencies of frequent Chinese character combination and characters, wherein the leaf nodes contain Chinese characters/character combinations (e.g. 51a) and occurrence frequencies thereof (e.g. 53a), and numbers (e.g. 55a to 55p) bracketed in branch nodes represent an encoded digit. Each Chinese character/character combination is represented by a series of encoded digits along a traversal path from the root node to the corresponding leaf node. Subsequently, the encoding table as shown in Table 2 is generated.

TABLE 2

| Chinese Character/Character combination | Representative code |
|---|---|
| 阿三 | 00 |
| 我 | 01 |
| 叫 | 100 |
| 李 | 1010 |
| , | 1011 |
| 你 | 1100 |
| 也 | 1101 |
| 可 | 1110 |
| 以 | 1111 |

In step S319, the received message is encoded contingent upon the generated encoding tables and the resulting message is "01 100 1010 00 1011 1100 1101 1110 1111 100 01 00". In steps S321, the encoded message with the encoding table is transmitted to a receiver, thereby enabling the receiver to decode the encoded message contingent upon the received encoding table.

Details of a method for English message compression are illustrated in the following example. In step S311, an original English message containing a series of alphanumeric characters, "I am Samuel, you can call me Sam", is received. In step S313, frequent alphanumeric character combinations, such as "ca" and "Sam", in the received message are acquired. In step S315, frequencies of the frequent alphanumeric character combinations and characters occurring in the received message are calculated, the result is shown in Table 3.

TABLE 3

| Alphanumeric Character/Character combination | Occurrence Frequency |
|---|---|
| a | 1 |
| ca | 4 |
| e | 2 |
| I | 1 |
| l | 3 |
| m | 2 |
| n | 2 |
| o | 1 |
| Sam | 6 |
| u | 2 |
| y | 1 |
| , | 1 |
| <space> | 7 |

Figure 6:
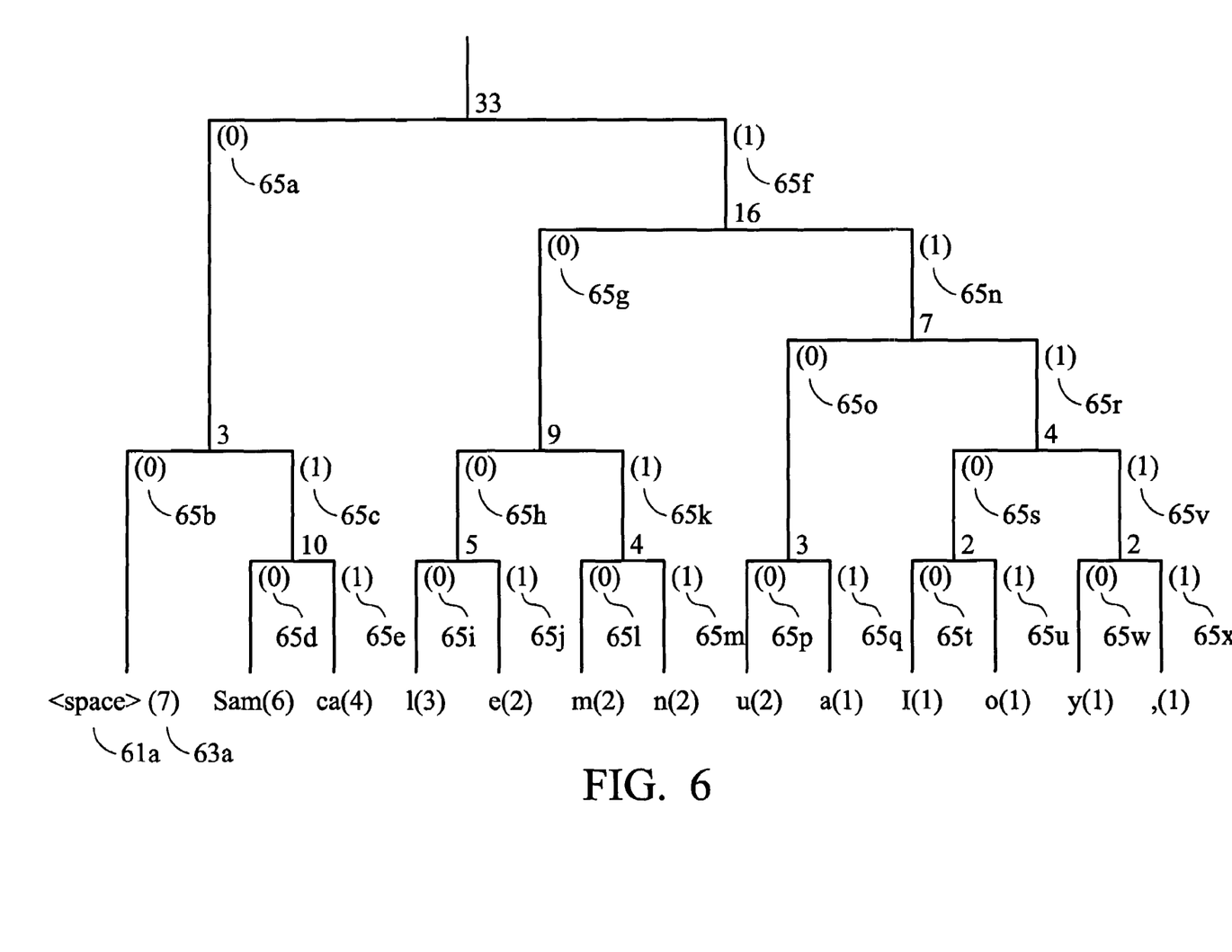

In order to precisely predict potential reduction lengths, note that the occurrence frequencies of frequent alphanumeric character combinations have to be adjusted by multiplying the length of frequent alphanumeric character combinations. For example, the frequent alphanumeric character combinations, "ca" and "Sam", are respectively composed of two and three alphanumeric characters, thus, the occurrence frequencies thereof are respectively 4(=2×2) and 6(=3×2). In step S317, an encoding table contingent upon occurrence frequencies of frequent alphanumeric character combinations and characters is generated using the Huffman encoding method. A Huffman tree as shown in FIG. 6, is first generated contingent upon occurrence frequencies of frequent alphanumeric character combinations and characters, wherein the leaf nodes contain alphanumeric characters/character combinations (e.g. 61a) and occurrence frequencies thereof (e.g. 63a), and numbers (e.g. 65a to 65x) bracketed in branch nodes represent an encoded digit. Each alphanumeric character/character combination is represented by a series of encoded digits along a traversal path from the root node to the corresponding leaf node. Subsequently, the encoding table as shown in Table 4 is generated.

TABLE 4

| Alphanumeric Character/Character combination | Representative code |
|---|---|
| <space> | 00 |
| Sam | 010 |
| ca | 011 |
| l | 1000 |
| e | 1001 |
| m | 1010 |
| n | 1011 |
| u | 1100 |
| a | 1101 |
| I | 11100 |
| o | 11101 |
| y | 11110 |
| , | 11111 |

In step S319, the received message is encoded contingent upon the generated encoding table, and the resulting message is "11100 00 1101 1010 00 010 1100 1001 1000 11111 00 11110 11101 1100 00 011 1011 00 011 1000 1000 00 1010 1001 00 010". In steps S321, the encoded message with the encoding table is transmitted to a receiver, thereby enabling the receiver to decode the encoded message contingent upon the received encoding table.

Figure 7A:
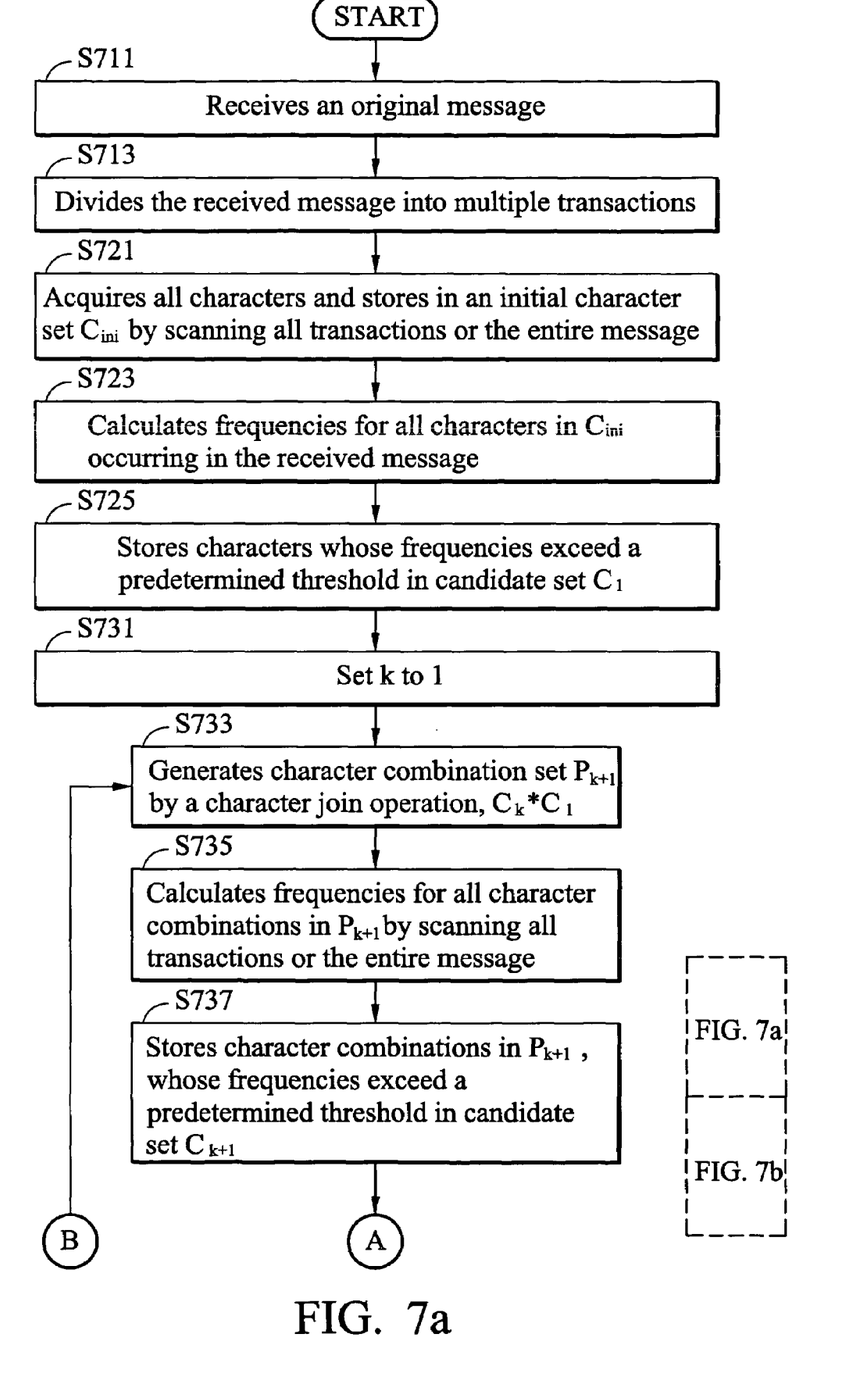
FIGS. 7a and 7b are flowcharts of an embodiment of a frequent character combination acquisition method.
Figure 7B:
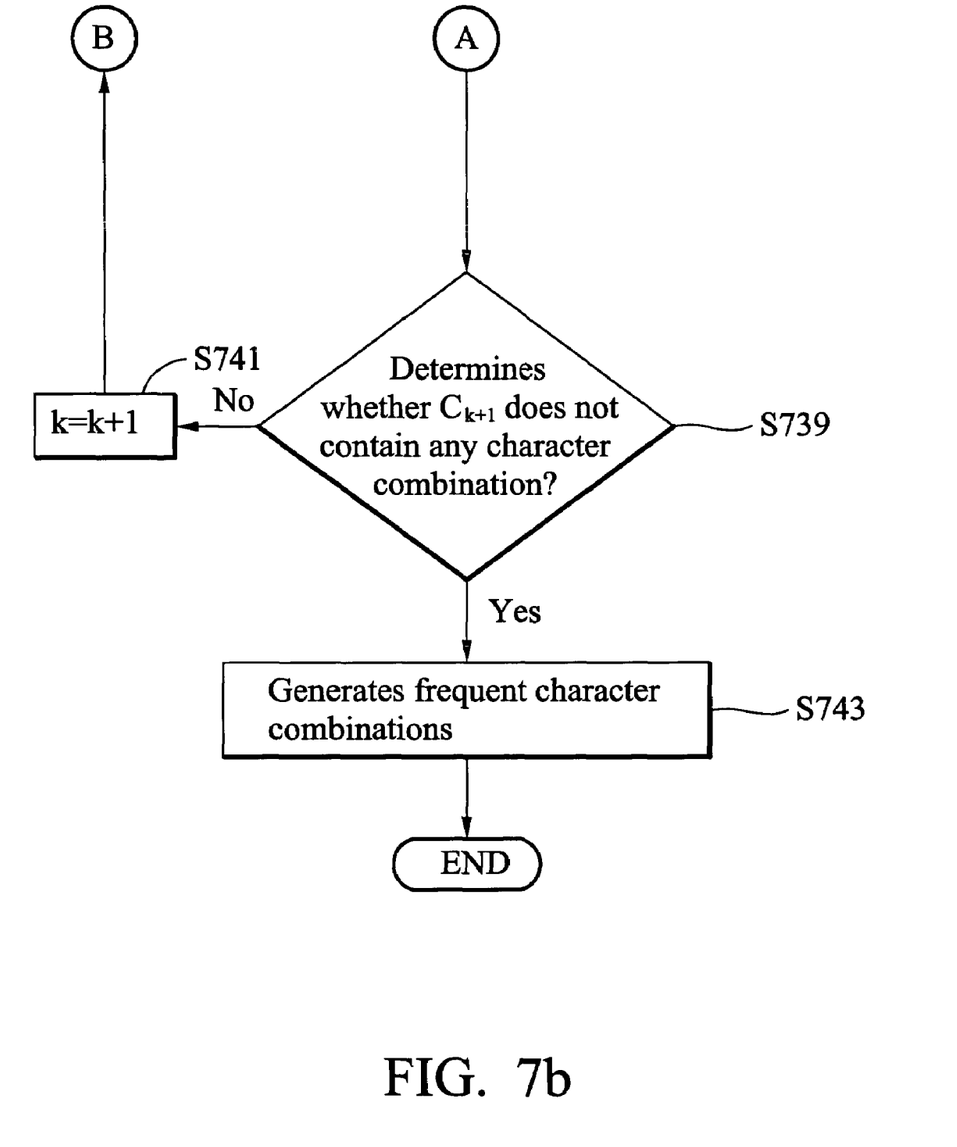

FIGS. 7a and 7b are flowcharts of an embodiment of a frequent character combination acquisition method. The process begins in step S711 to receive an original message. In step S713, the received message is divided into multiple transactions by particular characters and/or control characters, such as spaces, line feeds and the like. Note that this step may be omitted to improve computation performance. In step S721, all transactions or the entire message is scanned to acquire all characters and store to an initial character set $C_{ini}$. In step S723, frequencies for all characters in $C_{ini}$ occurring in the received message are calculated. In step S725, characters whose frequencies exceed a predetermined threshold are stored in candidate set $C_l$. In step S731, k is set to 1. In step S733, character combination set $P_{k+1}$ is generated by a character join operation, $C_k*C_1$. In step S735, all transactions or the entire message is scanned to calculate frequencies for all character combinations in $P_{k+1}$. In step S737, character combinations in $P_{k+1}$, whose frequencies exceed a predetermined threshold are stored in candidate set $C_{k+1}$. In step S739, it is determined whether $C_{k+1}$ does not contain any character combination, if so, the process proceeds to step S743, and otherwise, to step S741. In step S741, k is increased by 1. In step S743, frequent character combinations are generated contingent upon $C_2$ to $C_k$.

Details of a method for frequent character combination acquisition are illustrated in the following example. In step S711, an original message "I am Samuel, you can call me Sam" is received. In step S713, the received message is divided into multiple transactions as shown in Table 5 by spaces.

TABLE 5

| Item Number | Transaction |
|---|---|
| 1 | I |
| 2 | am |
| 3 | Samuel, |
| 4 | you |
| 5 | can |
| 6 | call |
| 7 | me |
| 8 | Sam |

In step S721, all transactions are scanned to acquire all characters and stored in an initial character set $C_{ini}$. In step S723, frequencies for all characters in $C_{ini}$, occurring in the received message are calculated, the result is shown in Table 6.

TABLE 6

| Item Number | Character | Occurrence Frequency |
|---|---|---|
| 1 | a | 5* |
| 2 | c | 2* |
| 3 | e | 2* |
| 4 | I | 1 |
| 5 | l | 3* |
| 6 | m | 4* |
| 7 | o | 1 |
| 8 | S | 2* |
| 9 | u | 2* |
| 10 | y | 1 |
| 11 | , | 1 |

In step S725, while a predetermined threshold is set to two, characters whose frequencies exceeding two, such as "a", "c", "e", "l", "m", "s" and "u", are stored in candidate set $C_1$. In step S731, set k to 1. In step S733, character combination set $P_2$ is generated by a character join operation, $C_1 * C_1$. In step S735, all transactions are scanned to calculate frequencies for all character combinations in $P_2$, the result is shown in Table 7.

TABLE 7

| Item Number | $P_2$ | Occurrence Frequency |
|---|---|---|
| 1 | aa | 0 |
| 2 | ac | 0 |
| 3 | ae | 0 |
| 4 | al | 1 |
| 5 | am | 3* |
| 6 | aS | 0 |
| 7 | au | 0 |
| 8 | ca | 2* |
| 9 | cc | 0 |
| 10 | ce | 0 |
| 11 | cl | 0 |
| 12 | cm | 0 |
| 13 | cS | 0 |
| 14 | cu | 0 |
| 15 | ea | 0 |
| 16 | ec | 0 |
| 17 | ee | 0 |
| 18 | el | 1 |
| 19 | em | 0 |
| 20 | eS | 0 |
| 21 | eu | 0 |
| 22 | la | 0 |
| 23 | lc | 0 |
| 24 | le | 0 |
| 25 | ll | 1 |
| 26 | lm | 0 |
| 27 | lS | 0 |
| 28 | lu | 0 |
| 29 | ma | 0 |
| 30 | mc | 0 |
| 31 | me | 1 |
| 32 | ml | 0 |
| 33 | mm | 0 |
| 34 | mS | 0 |
| 35 | mu | 1 |
| 36 | Sa | 2* |
| 37 | Sc | 0 |
| 38 | Se | 0 |
| 39 | Sl | 0 |
| 40 | Sm | 0 |
| 41 | SS | 0 |
| 42 | Su | 0 |
| 43 | ua | 0 |
| 44 | uc | 0 |
| 45 | ue | 1 |
| 46 | ul | 0 |
| 47 | um | 0 |
| 48 | uS | 0 |
| 49 | uu | 0 |

In step S737, character combinations in $P_2$, whose frequencies exceed two, such as "am", "ca" and "sa", are stored in candidate set $C_2$.

Subsequently, in step S741, set k to 2. In step 733, character combination set $P_3$ is generated by a character join operation, $C_2 * C_1$. In step S735, all transactions are scanned to calculate frequencies for all character combinations in $P_3$, the result is shown in Table 8.

TABLE 8

| Item Number | $P_3$ | Occurrence Frequency |
|---|---|---|
| 1 | ama | 0 |
| 2 | amc | 0 |
| 3 | ame | 0 |
| 4 | aml | 0 |
| 5 | amm | 0 |
| 6 | amS | 0 |
| 7 | amu | 0 |
| 8 | caa | 0 |
| 9 | cac | 0 |
| 10 | cae | 0 |
| 11 | cal | 0 |
| 12 | cam | 0 |
| 13 | caS | 0 |
| 14 | cau | 0 |
| 15 | Saa | 0 |
| 16 | Sac | 0 |
| 17 | Sae | 0 |
| 18 | Sal | 0 |

TABLE 8-continued

| Item Number | $P_3$ | Occurrence Frequency |
|---|---|---|
| 19 | Sam | 2* |
| 20 | SaS | 0 |
| 21 | Sau | 0 |

In step S737, character combination in $P_3$, whose frequency exceeds two, such as "Sam", is stored in candidate set $C_3$. Finally, in step S743, frequent character combinations, such as "Sam" and "ca", are generated contingent upon $C_2$ to $C_3$. Note that "Sa" and "am" are not frequent character combinations while "Sam" is superset of "Sa" and "am".

Details of the method for frequent character combination acquisition are illustrated in another example. In step S711, an original message "我叫李阿三, 你也可以叫我阿三" is received. In step S721, the entire message is scanned to acquire all characters and store to an initial character set $C_{ini}$. In step S723, frequencies for all characters in $C_{ini}$ occurring in the received message are calculated, the result is shown in Table 9.

TABLE 9

| Item Number | Character | Occurrence Frequency |
|---|---|---|
| 1 | 我 | 2* |
| 2 | 叫 | 2* |
| 3 | 李 | 1 |
| 4 | 阿 | 2* |
| 5 | 三 | 2* |
| 6 | , | 1 |
| 7 | 你 | 1 |
| 8 | 也 | 1 |
| 9 | 可 | 1 |
| 10 | 以 | 1 |

In step S725, while a predetermined threshold is set to two, characters whose frequencies exceed two, such as "我", "叫", "阿" and "三", are stored in candidate set $C_1$. In step S731, set k to 1. In step S733, character combination set $P_2$ is generated by a character join operation, $C_1*C_1$. In step S735, the entire message is scanned to calculate frequencies for all character combinations in $P_2$, the result is shown in Table 10.

TABLE 10

| Item Number | $P_2$ | Occurrence Frequency |
|---|---|---|
| 1 | 我我 | 0 |
| 2 | 我叫 | 1 |
| 3 | 我阿 | 0 |
| 4 | 我三 | 0 |
| 5 | 叫我 | 1 |
| 6 | 叫叫 | 0 |
| 7 | 叫阿 | 0 |
| 8 | 叫三 | 0 |
| 9 | 阿我 | 0 |
| 10 | 阿叫 | 0 |
| 11 | 阿阿 | 0 |

TABLE 10-continued

| Item Number | $P_2$ | Occurrence Frequency |
|---|---|---|
| 12 | 阿三 | 2* |
| 13 | 三我 | 0 |
| 14 | 三叫 | 0 |
| 15 | 三阿 | 0 |
| 16 | 三三 | 0 |

In step S737, character combination in $P_2$, whose frequencies exceeding two, such as "阿三", is stored in candidate set $C_2$.

Subsequently, in step S741, set k to 2. In step 733, character combination set $P_3$ is generated by a character join operation, $C_2*C_1$. In step S735, the entire message is scanned to calculate frequencies for all character combinations in $P_3$, the result is shown in Table 11.

TABLE 11

| Item Number | $P_3$ | Occurrence Frequency |
|---|---|---|
| 1 | 阿三我 | 0 |
| 2 | 阿三叫 | 0 |
| 3 | 阿三阿 | 0 |
| 4 | 阿三三 | 0 |

Finally, in step S743, frequent character combination, such as "阿三", is generated contingent upon $C_2$.

Figure 8:
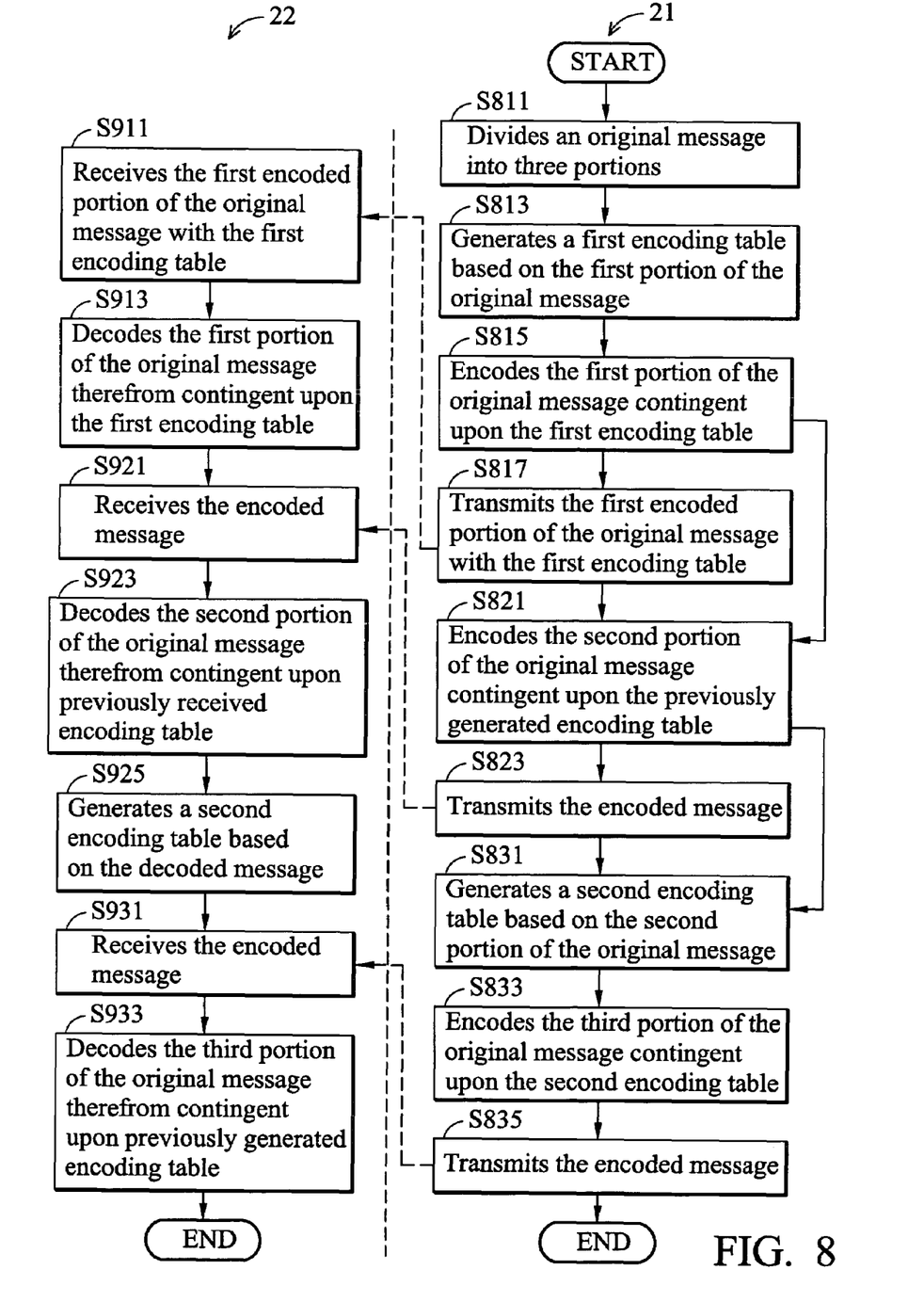
FIG. 8 is a flowchart of an embodiment of a method for encoding and transmitting message in portions.

In this method, before a long message is transmitted to a receiver, frequent character-sets thereto must be completely acquired by a transmitter, resulting in excessive time. When a long message can be sequentially divided into several portions and the content of each subsequent message is highly correlated to that of the prior message, required transmission bandwidth can be reduced by implementing the following embodiment of a method, and further, the encoded message can be more efficiently decoded by a receiver. FIG. 8 is a flowchart of an embodiment of a method for encoding and transmitting a message in portions, divided into two sections, a left section showing steps performed by a receiver (e.g. MS 22), and a right section showing steps performed by a transmitter (e.g. MS 21), separated by dashed lines for added clarity. The following embodiment of a method discloses that the entire message is divided into three portions to encode and transmit, with reduced complexity.

In step S811, an original message is divided into three portions by the MS 21. In step S813, a first encoding table based on the first portion of the original message is generated. In step S815, the first portion of the original message is encoded contingent upon the first encoding table. In step S817, the first encoded portion of the original message with the first encoding table is transmitted to the MS 22. In step S911, the encoded message with the first encoding table is received by the MS 22. In step S913, the first portion of the original message is decoded therefrom contingent upon the first encoding table.

In step S821, the second portion of the original message is encoded contingent upon the previously generated encoding table (i.e. the first encoding table). In step S823, the encoded message is transmitted to the MS 22. Note that this step only transmits the encoded message without any encoding table to save transmission bandwidth. In step S921, the encoded message is received by the MS 22. In step S923, the second portion of the original message is decoded therefrom contingent upon previously received encoding table (i.e. the first encoding table). In step S925, a second encoding table based on the decoded message. (i.e. the second portion of the original message) is generated.

In step S831, a second encoding table based on the second portion of the original message is generated by the MS 21. In step S833, the third portion of the original message is encoded contingent upon the second encoding table. In step S835, the encoded message is transmitted to the MS 22. Note that this step only transmits the encoded message without any encoding table to save transmission bandwidth. In step. S931, the encoded message is received by the MS 22. In step S933, the third portion of the original message is decoded therefrom contingent upon previously generated encoding table (i.e. the second encoding table).

While an original message is divided into more than three portions, however, in addition to the above steps, the transmitter further encodes a portion of the original message based on an encoding table generated based on the prior portion of original message. The receiver decodes a portion of the encoded message therefrom based on an encoding table been generated based on the prior decoded message.

While the invention has been described in terms of preferred embodiment, it is not intended to limit the invention to the precise embodiments disclosed herein. Those who are skilled in this technology can still make various alterations and modifications without departing from the scope and spirit of this invention. Therefore, the scope of the invention shall be defined and protected by the following claims and their equivalents.

What is claimed is:

1. A method of message compression, performed by an electronic apparatus, comprising:
   receiving a first text message;
   acquiring at least one frequent character combination in the first text message, the frequent character combination comprising at least two characters among a plurality of characters in the first text message;
   calculating frequencies for the frequent character combination and the characters occurring in the first text message;
   generating a plurality of representative codes respectively for the frequent character combination and the characters contingent upon frequencies for the frequent character combination and the characters, wherein the frequent character combination or one of the characters with higher frequencies is represented by one of the representative codes with fewer or equal digits; and
   encoding the first text message to a second text message contingent upon the representative codes,
   wherein the frequency of the frequent character combination is a length of the frequent character combination multiplied by an occurrence of the frequent character combination occurring in the first text message.

2. The method as claimed in claim 1 wherein the frequent character combination in the first text message is acquired by an association mining method.

3. The method as claimed in claim 2 wherein the association mining method acquires at least one of the potential character combinations whose frequency occurring in the first text message exceeds a threshold.

4. The method as claimed in claim 1 wherein the representative codes are generated by the Huffman coding method.

5. The method as claimed in claim 1 further comprising transmitting the second text message with the representative codes to a receiver, enabling the receiver to acquire the first text message from the second text message according to the representative codes.

6. The method as claimed in claim 1 further comprising:
   acquiring the characters in the first text message;
   obtaining frequencies respectively for the characters by scanning the first text message;
   storing the characters whose frequencies exceeding a threshold in a first character combination set;
   generating a plurality of character combinations by self-joining the characters in the first character combination set;
   storing the character combinations in a second character combination set;
   respectively obtaining frequencies for the character combinations in the second character combination set by scanning the first text message;
   storing the character combinations whose frequencies exceed the threshold in a third character combination set; and
   obtaining a character combination in the third character combination set as the frequent character combination.

7. The method as claimed in claim 1 wherein an original text message divided into a first portion, a second portion and a third portion is provided, the first text message is the first portion of the original text message, and the representative codes are a plurality of first representative codes.

8. The method as claimed in claim 7 further comprising:
   encoding the second portion of the original text message contingent upon the first representative codes;
   transmitting the second encoded portion of the original text message;
   generating a plurality of second representative codes corresponding to the second portion of the original text message;
   encoding the third portion of the original text message contingent upon the second representative codes; and
   transmitting the third encoded portion of the original text message.

9. A machine-readable storage medium for storing a computer program which, when executed by an electronic apparatus, performs a method of message compression, the method comprising:
   receiving a first text message;
   acquiring at least one frequent character combination in the first text message, the frequent character combination comprising at least two characters among a plurality of characters in the first text message;
   calculating frequencies for the frequent character combination and the characters occurring in the first text message;
   generating a plurality of representative codes respectively for the frequent character combination and the characters contingent upon frequencies for the frequent character combination and the characters, wherein the frequent character combination or one of the characters with higher frequencies is represented by one of the representative codes with fewer or equal digits; and
   encoding the first text message to a second text message contingent upon the representative codes,
   wherein the frequency of the frequent character combination is a length of the frequent character combination multiplied by an occurrence of the frequent character combination occurring in the first text message.

10. A system for message compression, comprising:
- a transmitter for encoding a second text message according to a plurality of first representative codes, wherein the plurality of first representative codes are calculated from a first text message; and
- a receiver for storing the first text message and receiving the encoded second text message from the transmitter, wherein the receiver calculates the plurality of first representative codes from the first text message and decodes the encoded second text message according to the plurality of first representative codes.

11. The system as claimed in claim 10 wherein the transmitter encodes a third text message according to a plurality of second representative codes, wherein the plurality of second representative codes are calculated from the second text message, and the receiver receives the encoded third text message from the transmitter, wherein the receiver calculates the plurality of second representative codes from the second text message and decodes the encoded third text message according to the plurality of second representative codes.

12. The system as claimed in claim 11 wherein the transmitter acquires at least one frequent character combination in the first text message and the frequent character combination in the first text message is acquired by an association mining method and the association mining method acquires at least one of the potential character combinations whose frequency occurring in the first text message exceeds a threshold.

13. The system as claimed in claim 10 wherein the representative codes are generated by the Huffman coding method.

14. The system as claimed in claim 10 wherein the transmitter calculates frequencies for the frequent character combination and a plurality of characters occurring in the first text message, generates a plurality of representative codes respectively for the frequent character combination and the characters contingent upon frequencies for the frequent character combination.

15. The system as claimed in claim 14 wherein the frequency of the frequent character combination is a length of the frequent character combination multiplied by an occurrence of the frequent character combination occurring in the first text message.

16. The system as claimed in claim 10 wherein the transmitter acquires the characters in the first text message, obtains frequencies respectively for the characters by scanning the first text message, stores the characters whose frequencies exceeding a threshold in a first character combination set, generates a plurality of character combinations by self-joining the characters in the first character combination set, stores the character combinations in a second character combination set, obtains frequencies respectively for the character combinations in the second character combination set by scanning the first text message, stores the character combinations whose frequencies exceeding the threshold in a third character combination set and obtains a character combination in the third character combination set as the frequent character combination.

17. The system as claimed in claim 16 wherein an original text message divided into a first portion, a second portion and a third portion is provided, the first text message is the first portion of the original text message, and the representative codes are a plurality of first representative codes.

18. The system as claimed in claim 17 wherein the transmitter apparatus encodes the second portion of the original text message contingent upon the first representative codes, transmits the second encoded portion of the original text message, generates a plurality of second representative codes corresponding to the second portion of the original text message, encodes the third portion of the original text message contingent upon the second representative codes and transmits the third encoded portion of the original text message.

* * * * *

UNITED STATES PATENT AND TRADEMARK OFFICE
CERTIFICATE OF CORRECTION

PATENT NO. : 7,616,136 B2　　　　　　　　　　　　　　　　　　　　　Page 1 of 1
APPLICATION NO. : 11/338982
DATED : November 10, 2009
INVENTOR(S) : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 962 days.

Signed and Sealed this

Fourteenth Day of December, 2010

David J. Kappos
*Director of the United States Patent and Trademark Office*